(12) United States Patent
Kawamura

(10) Patent No.: US 9,516,776 B2
(45) Date of Patent: Dec. 6, 2016

(54) ELECTRONIC COMPONENT ASSEMBLY, CONNECTION STRUCTURE BETWEEN ELECTRONIC COMPONENT ASSEMBLY AND TERMINAL FITTING, AND ELECTRICAL CONNECTION BOX HAVING ELECTRONIC COMPONENT ASSEMBLY

(71) Applicant: Yazaki Corporation, Tokyo (JP)

(72) Inventor: Yukihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 94 days.

(21) Appl. No.: 14/619,322

(22) Filed: Feb. 11, 2015

(65) Prior Publication Data

US 2015/0163943 A1 Jun. 11, 2015

Related U.S. Application Data

(63) Continuation of application No. PCT/JP2013/072138, filed on Aug. 20, 2013.

(30) Foreign Application Priority Data

Aug. 21, 2012 (JP) ................. 2012-182525

(51) Int. Cl.
*H01H 45/04* (2006.01)
*H01H 45/14* (2006.01)
(Continued)

(52) U.S. Cl.
CPC .............. *H05K 7/103* (2013.01); *H01H 45/04* (2013.01); *H01H 45/14* (2013.01); *H01H 50/048* (2013.01); *H01H 2050/049* (2013.01)

(58) Field of Classification Search
CPC .... H05K 7/1031; H01H 50/048; H01H 45/04; H01H 45/14; H01H 2050/049; H01L 23/3107; H01L 23/3114; H01L 23/32; H01L 31/0201
(Continued)

(56) References Cited

U.S. PATENT DOCUMENTS 5,579,211 A * 11/1996 Hendel ................ H01H 50/048
361/729
6,270,359 B1 * 8/2001 Kondo ................ B60R 16/0239
439/76.2
(Continued)

FOREIGN PATENT DOCUMENTS

DE 4437954 C1 2/1996
FR 2951315 A1 4/2011
(Continued)

OTHER PUBLICATIONS

Supplementary European Search Report dated Mar. 15, 2016, issued for the European patent application No. 13830812.7.
(Continued)

*Primary Examiner* — Anthony Haughton
*Assistant Examiner* — Yahya Ahmad
(74) *Attorney, Agent, or Firm* — Locke Lord LLP

(57) ABSTRACT

Provided is an electronic component assembly that can reduce a housing space in a fitting direction of a bus bar and a terminal fitting. An electronic component assembly includes a relay, a diode, a plurality of bus bars, and a plate-shaped resin member. The relay has a relay main body having a rectangular parallelepiped outer shape, and a plurality of terminal portions protruding from a bottom surface of the relay main body. The plurality of bus bars is configured such that one end side is soldered to a terminal portion of the relay or a terminal portion of the diode, and the other end is fitted to a terminal fitting. The one end sides of the plurality of bus bars are embedded in the resin member.

18 Claims, 9 Drawing Sheets

(51) Int. Cl.
*H01H 50/04* (2006.01)
*H05K 7/10* (2006.01)

(58) Field of Classification Search
USPC .................................. 361/728–747
See application file for complete search history.

(56) References Cited

U.S. PATENT DOCUMENTS

| | | | | |
|---|---|---|---|---|
| 6,409,522 | B1* | 6/2002 | Onizuka | H01R 4/021 439/74 |
| 7,780,475 | B1* | 8/2010 | Parker | H01H 50/048 439/620.06 |
| 2008/0119066 | A1* | 5/2008 | Shimizu | H05K 7/026 439/76.1 |
| 2014/0060877 | A1* | 3/2014 | Yamamoto | H01R 13/113 174/59 |
| 2015/0382497 | A1* | 12/2015 | Kawamura | B60R 16/0238 361/728 |

FOREIGN PATENT DOCUMENTS

| | | |
|---|---|---|
| JP | 01-102826 A | 4/1989 |
| JP | 05-266773 A | 10/1993 |
| JP | 08-031292 A | 2/1996 |
| JP | 2002-133988 A | 5/2002 |
| JP | 2008-226724 A | 9/2008 |
| JP | 2010-221787 A | 10/2010 |

OTHER PUBLICATIONS

International Search Report mailed Oct. 8, 2013, issued for PCT/JP2013/072138.

* cited by examiner

ELECTRONIC COMPONENT ASSEMBLY, CONNECTION STRUCTURE BETWEEN ELECTRONIC COMPONENT ASSEMBLY AND TERMINAL FITTING, AND ELECTRICAL CONNECTION BOX HAVING ELECTRONIC COMPONENT ASSEMBLY

TECHNICAL FIELD

The present invention relates to an electronic component assembly, a connection structure between the electronic component assembly and a terminal fitting, and an electrical connection box having the electronic component assembly.

BACKGROUND ART

FIG. 7 is a perspective view of a conventional relay. FIG. 8 is a perspective view of a connection structure between a terminal fitting and the relay illustrated in FIG. 7. FIG. 9 is a plan view of the connection structure between the relay and the terminal fitting illustrated in FIG. 8. FIG. 10 is a cross-sectional view taken along a line A-A in FIG. 9.

As illustrated in FIG. 7, a conventional relay 301 has a relay main body 302 having a rectangular parallelepiped outer shape, and a plurality of plate-shaped terminal portions 303 that protrudes from a bottom surface 302b of the relay main body 302 and is fitted to a terminal fitting 304 (illustrated in FIG. 10). In addition, reference numeral 302a in FIG. 7 illustrates a top surface of the relay main body 302, reference numerals 302c to 302f illustrate side surfaces of the relay main body 302. In addition, an arrow K illustrates a fitting direction of the terminal portion 303 and the terminal fitting 304.

In this specification, a surface of the terminal portion protruding from the relay main body (that is, a component main body) is referred to as a "bottom surface", regardless of the orientation of the relay main body, and the opposite surface thereof is referred to as a "top surface".

As illustrated in FIGS. 8 to 10, the conventional "connection structure 307 between the relay and the terminal fitting" has the relay 301 illustrated in FIG. 7, a plurality of terminal fittings 304 fitted to the plurality of terminal portions 303 of the relay 301, and a holding member 306 on which the relay 301 and the terminal fitting 304 are mounted. Furthermore, in FIG. 9, one of the two relays 301 is not illustrated to describe the holding member 306.

As illustrated in FIG. 10, the terminal fitting 304 has a female connection portion that is fitted to the terminal portion 303 of the relay 301. Furthermore, the terminal fitting 304 is connected to the end portion of an electric wire 305.

The holding member 306 is made of a synthetic resin. As illustrated in FIG. 8, the holding member 306 is provided with two relay mounting portions 363. The relay mounting portion 363 includes a placing surface 360 on which the relay main body 302 is placed, a plurality of housing chambers 361 that is formed below the placing surface 360 to house the terminal portions 303 and the terminal fittings 304, and a lance 362 that is provided in the housing chambers 361 and is locked to the terminal fitting 304. In addition, reference numeral 364 in FIG. 8 is a locking portion that is locked to a casing, such as an electrical connection box.

The aforementioned "connection structure 307 between the relay and the terminal fitting" is housed, for example, in a casing made of a synthetic resin and forms an automotive electrical connection box (see Patent Literature 1).

CITATION LIST

Patent Literature

Patent Literature 1: JP 2010-221787 A

SUMMARY OF INVENTION

Technical Problem

However, in a structure such as an electrical connection box having the above-described conventional relay 301, at minimum, there has been a need for a housing space of a dimension obtained by adding a height dimension h11 of the relay main body 302 and a height dimension h12 of the holding member 306, and there has been a problem in that dimensions in a height direction, that is, dimensions in a fitting direction of the terminal portion 303 and the terminal fitting 304 increase. Note that the height dimension h12 of the holding member 306 is approximately two or three times the length of the terminal portion 303.

Note that the above-mentioned problems similarly occur, for example, even in a structure having an electronic component in which a plurality of terminal portions protrudes from a bottom surface of a rectangular parallelepiped-shaped component main body, other than the structure having the relay 301.

Accordingly, an object of the present invention is to provide an electronic component assembly, a connection structure between the electronic component assembly and the terminal fitting, and an electrical connection box having the electronic component assembly that can reduce the housing space in the fitting direction of a bus bar and the terminal fitting.

Solution to Problem

In order to achieve the above-described object, according to one aspect of the present invention, there is provided an electronic component assembly that has an electronic component and a plurality of bus bars, the electronic component being provided with a component main body having a rectangular parallelepiped outer shape, and a plurality of terminal portions protruding from a bottom surface of the component main body, one end sides of the bus bars being electrically connected to the terminal portion, and the other ends thereof being fitted to a terminal fitting, wherein the other ends of the plurality of bus bars are opposite to the side surface of the component main body.

According to a first preferred aspect of the present invention, in the one aspect of the present invention, the electronic component assembly further includes a resin member to which the one end sides of the plurality of bus bars are attached.

According to a second preferred aspect of the present invention, in the first preferred aspect of the present invention, the plurality of bus bars is bent at a right angle in contact with the resin member, or is bent at a right angle in the interior of the resin member.

According to a third preferred aspect of the present invention, in any one of the one aspect to the second preferred aspect of the present invention, the other ends of the plurality of bus bars are opposite to two opposing side surfaces of the component main body.

According to a fourth preferred aspect of the present invention, there is provided a connection structure between the electronic component assembly and the terminal fitting, in which the connection structure has the electronic component assembly according to any one of the one aspect to the third preferred aspect of the present invention, a plurality of terminal fittings to be fitted to the plurality of bus bars, and a holding member in which the electronic component assembly and the plurality of terminal fittings are housed.

According to a fifth preferred aspect of the present invention, there is provided an electrical connection box that has the electronic component assembly according to any one of the one aspect to the third preferred aspect of the present invention, a plurality of terminal fittings to be fitted to the plurality of bus bars, and a holding member in which the electronic component assembly and the plurality of terminal fittings are housed.

Advantageous Effects of Invention

According to the one aspect of the present invention, in the electronic component assembly that has the electronic component and the plurality of bus bars, the electronic component being provided with the component main body having the rectangular parallelepiped outer shape, and the plurality of terminal portions protruding from the bottom surface of the component main body, one end sides of the bus bars being electrically connected to the terminal portion, and the other ends thereof being fitted to a terminal fitting, in which the other ends of the plurality of bus bars are opposite to the side surface of the component main body. Thus, it is possible to provide the electronic component assembly that is capable of reducing the housing space in the fitting direction of the bus bar and the terminal fitting.

According to the first preferred aspect of the present invention, since the electronic component assembly further has the resin member to which the one end sides of the plurality of bus bars are attached, at the time of mounting the electronic component assembly to the holding member, the electronic component assembly can be easily mounted by pressing the resin member.

According to the second preferred aspect of the present invention, since the plurality of bus bars is bent at a right angle in contact with the resin member or is bent at a right angle in the interior of the resin member, the resin member can receive the force applied to the bus bar when the bus bar and the terminal fitting are fitted, and therefore, it is possible to prevent the bus bar from being deformed.

According to the third preferred aspect of the present invention, since the other ends of the plurality of bus bars are opposite to the two opposing side surfaces of the component main body, it is possible to provide an electronic component assembly that can reduce the housing space in the fitting direction of the bus bar and the terminal fitting.

According to the fourth preferred aspect of the present invention, since the connection structure has the electronic component assembly according to any one of the one aspect to the third preferred aspect of the present invention, the plurality of terminal fittings to be fitted to the plurality of bus bars, and the holding member in which the electronic component assembly and the plurality of terminal fittings are housed, it is possible to provide the connection structure between the electronic component assembly and the terminal fitting that can reduce the housing space in the fitting direction of the bus bar and the terminal fitting of the electronic component assembly.

According to the fifth preferred aspect of the present invention, since the electrical connection box has the electronic component assembly according to any one of the one aspect to the third preferred aspect of the present invention, the plurality of terminal fittings to be fitted to the plurality of bus bars, and the holding member in which the electronic component assembly and the plurality of terminal fittings are housed, it is possible to provide the electrical connection box that can reduce the housing space in the fitting direction of the bus bar and the terminal fitting of the electronic component assembly.

DESCRIPTION OF EMBODIMENTS (First Embodiment)

An "electronic component assembly", a "connection structure between the electronic component assembly and a terminal fitting" and an "electrical connection box" according to a first embodiment of the present invention will be described with reference to FIGS. 1 to 5.

Figure 1:
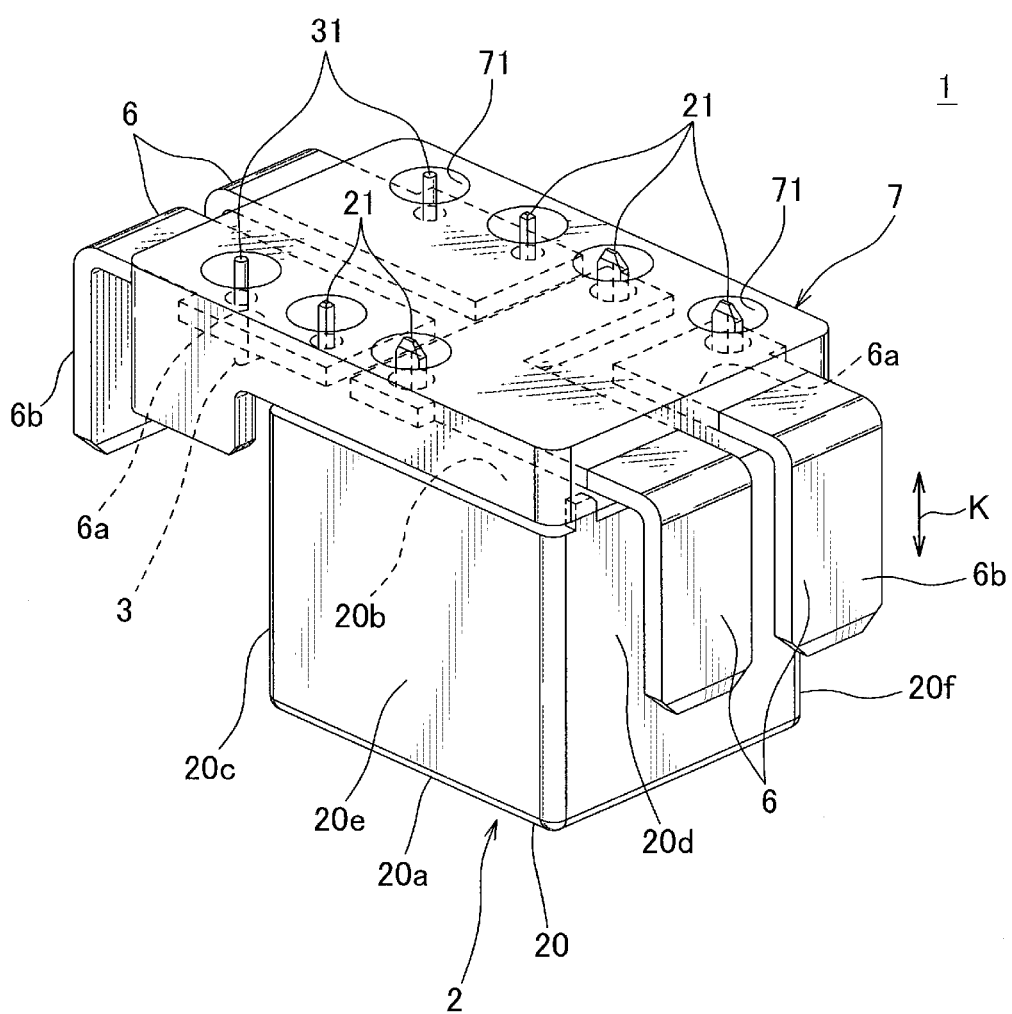
FIG. 1 is a perspective view of an electronic component assembly according to a first embodiment of the present invention.

An electronic component assembly 1 illustrated in FIG. 1 is configured from a relay ("electronic component" in the aspects of the present invention) 2, a diode 3, a plurality of bus bars 6, and a resin member 7.

The relay 2 has a relay main body ("component main body" in the aspects of the present invention) 20 having a rectangular parallelepiped outer shape, a plurality of terminal portions 21 protruding from a bottom surface 20$b$ of the relay main body 20. The relay main body 20 has a top surface 20$a$ and the bottom surface 20$b$ opposite to each other, a side surface 20$c$ and a side surface 20$d$ opposite to each other, and a side surface 20$e$ and a side surface 20$f$ opposite to each other. Five terminal portions 21 are provided in total. Furthermore, in the present embodiment, a substrate relay 2 is used to reduce the dimension of the electronic component assembly 1, but in the present invention, it is also possible to use a plug-in type relay.

The plurality of bus bars 6 is obtained by performing a press working or the like on a metal plate, and four bus bars are provided in total. These bus bars 6 are configured such that one end 6a side is electrically connected to a terminal portion 21 of the relay 2 or a terminal portion 31 of the diode 3, and the other end 6b thereof is fitted to a terminal fitting 4 (illustrated in FIG. 4). In addition, the terminal portion 21 of the relay 2 and the terminal portion 31 of the diode 3 are soldered to the bus bar 6 through a through hole formed on one end 6a side of the bus bar 6.

The resin member 7 is formed in a plate shape by an insulating synthetic resin. One end 6a sides of the plurality of bus bars 6 are attached by being embedded in the resin member 7. In addition, the resin member 7 is formed with a through hole 71 for allowing the terminal portion 21 of the relay 2 and the terminal portion 31 of the diode 3 to pass through the through hole formed in one end 6a side of the bus bar 6.

In addition, two of the plurality of bus bars 6 protrude from each of the two opposing side surfaces of the resin member 7, and are bent at a right angle to the top surface 20a side of the relay main body 20. For this reason, the other ends 6b of the bus bars 6 are opposite to the two opposing side surfaces 20c and 20d of the relay main body 20. In addition, an arrow K of FIG. 1 illustrates a fitting direction of the other end 6b of the bus bar 6 and the terminal fitting 4. Furthermore, the other ends 6b of the two bus bars 6 opposite to the side surface 20c of the relay main body 20 are spaced in a direction perpendicular to the arrow K. Similarly, the other ends 6b of the two bus bars 6 opposite to the side surface 20d of the relay main body 20 are spaced in the direction perpendicular to the arrow K.

When assembling such an electronic component assembly 1, first, the one end 6a sides of the plurality of bus bars 6 are attached to the resin member 7 by insert molding. Moreover, the terminal portion 21 of the relay 2 and the terminal portion 31 of the diode 3 pass through the through hole 71 of the resin member 7 and the through hole of the bus bar 6, and the terminal portions 21 and 31 are assembled by being soldered to the bus bar 6.

In addition, the bus bar 6 of the present embodiment is configured such that the one end 6a side is attached by being embedded in the resin member 7 by insert molding, but in the present invention, the one end 6a side of the bus bar 6 may be attached by being locked to the resin member 7, other than the insert molding.

Figure 2:
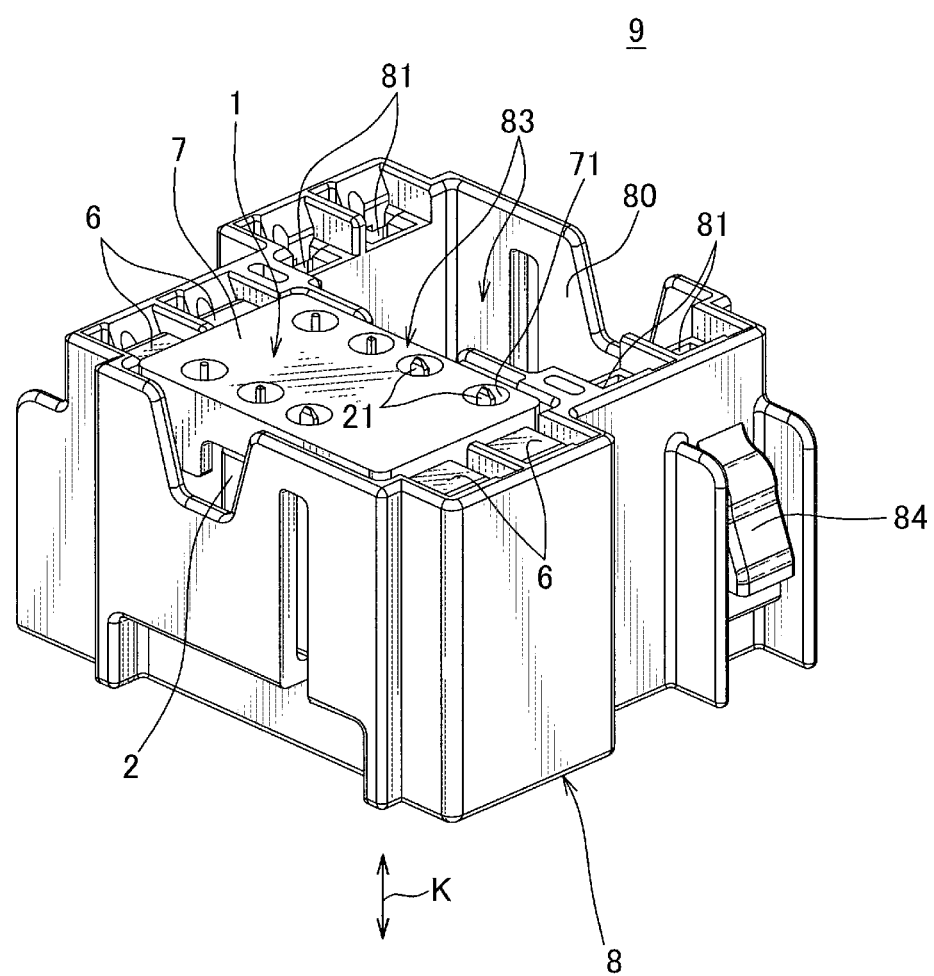
FIG. 2 is a perspective view of a connection structure between a terminal fitting and the electronic component assembly illustrated in FIG. 1.
Figure 3:
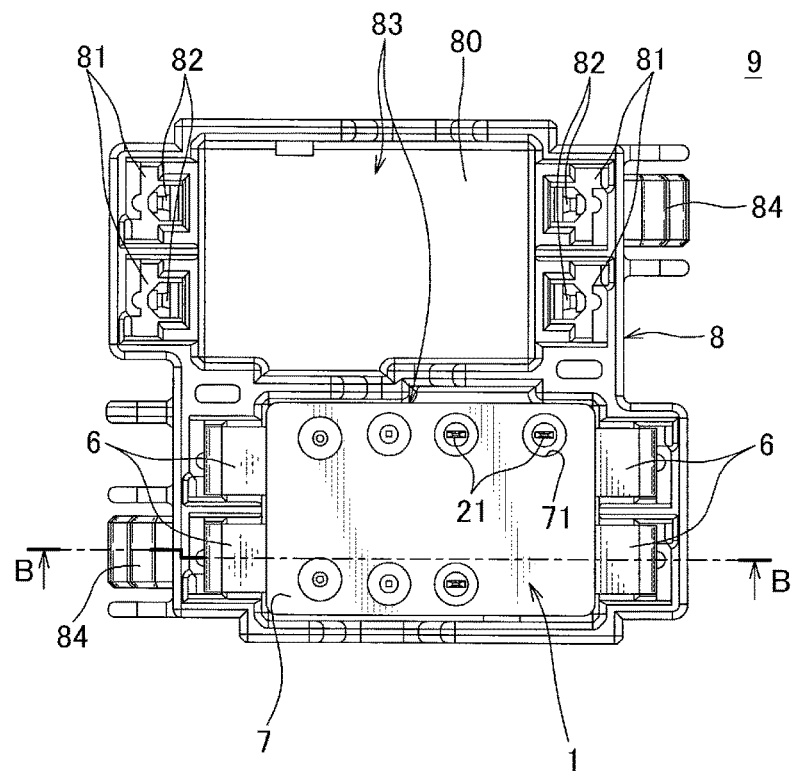
FIG. 3 is a plan view of the connection structure between the electronic component assembly and the terminal fitting illustrated in FIG. 2.
Figure 4:
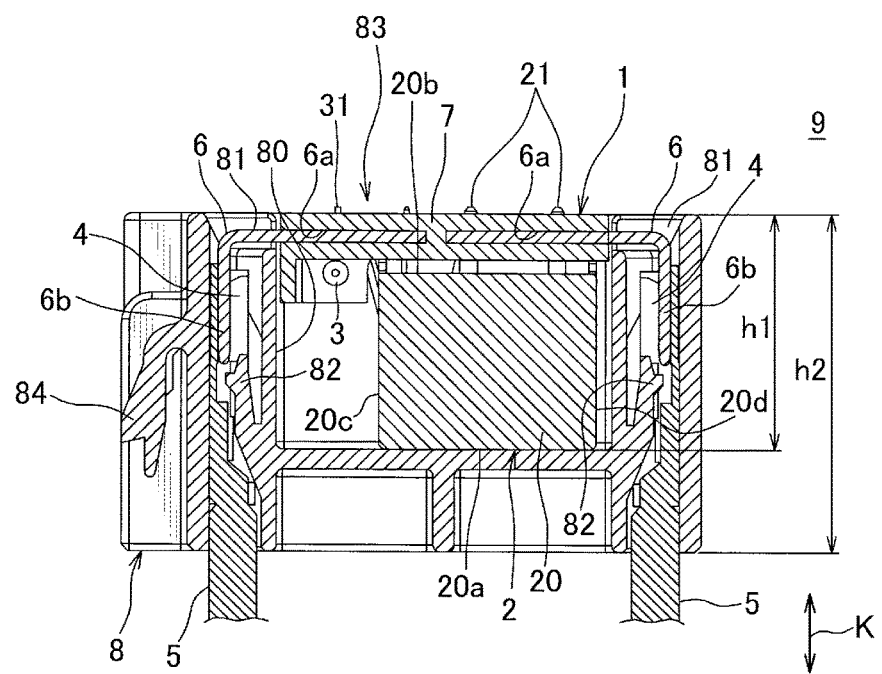
FIG. 4 is a cross-sectional view taken along a line B-B of FIG. 3.

The "connection structure 9 between the electronic component assembly and the terminal fitting" illustrated in FIGS. 2 to 4 has the electronic component assembly 1 illustrated in FIG. 1, a plurality of terminal fittings 4 fitted to a plurality of bus bars 6 of the electronic component assembly 1, and a holding member 8 in which the electronic component assembly 1 and the plurality of terminal fittings 4 are housed. Furthermore, in FIG. 3, in order to describe the holding member 8, one of the two electronic component assemblies 1 is not illustrated.

Figure 5:
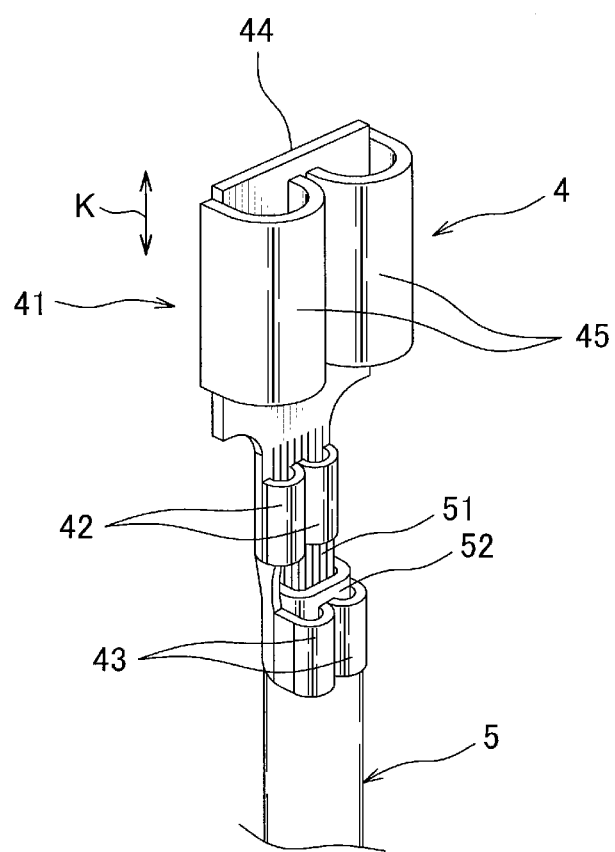
FIG. 5 is a perspective view of an electric wire with the terminal fitting illustrated in FIG. 4.

As illustrated in FIG. 5, the terminal fitting 4 is obtained by performing the press working or the like on a metal plate, and is connected to the end portion of the electric wire 5. The terminal fitting 4 has a female connection portion 41 fitted to the other end 6b of the bus bar 6 of the electronic component assembly 1, a pair of crimping pieces 42 that caulks a core wire 51 exposed by removing an insulating coating 52 at the end portion of the electric wire 5, and a pair of crimping pieces 43 that caulks a portion of the insulating coating 52. In addition, the connection portion 41 has a flat plate portion 44, and a pair of spring portions 45 which is erected from both ends of the flat plate portion 44 and in which the tip is bent to the flat plate portion 44 side. Such a terminal fitting 4 is fitted to the bus bar 6 so as to interpose the other end 6b of the bus bar 6 between the flat plate portion 44 and the tip of the pair of spring portions 45.

Furthermore, the terminal fitting 4 of this embodiment is a type in which the connection portion 41 is referred to as a "Faston type", but in the present invention, the shape of the connection portion is not limited to the Faston type, and the connection portion may have a cylinder in which the other end 6b of the bus bar 6 can be housed, and a biasing spring disposed in the cylinder, or may be a tuning fork shape having a slot into which the other end 6b of the bus bar 6 is inserted.

The holding member 8 is formed of a synthetic resin. As illustrated in FIGS. 2 and 3, two electronic component assembly housing portions 83 are provided in the holding member 8. As illustrated in FIG. 4, the electronic component assembly housing portion 83 is constituted by a first housing chamber 80 that houses the relay 2, two second housing chambers 81 that are formed on each of the both sides of the first housing chamber 80 to house the other ends 6b of each bus bar 6 and the terminal fittings 4, and a lance 82 that is provided in each of the second housing chambers 81 to lock the terminal fitting 4. The first housing chamber 80 is formed in a concave shape that opens upward. The second housing chamber 81 is formed in a cylindrical shape that vertically opens. The lance 82 extends from the inner surface of the second housing chamber 81. In addition, the lance 82 holds the terminal fitting 4 by being locked to the edge of the spring portion 45 of the terminal fitting 4. Also, on the outer surface of the holding member 8, a locking portion 84 locked to a casing, such as an electrical connection box, is provided.

Furthermore, the two electronic component assembly housing portions 83 are provided in the holding member 8 of this embodiment, but in the present invention, the number of electronic component assembly housing portions 83 is not limited to two, and the number may be one or three or more.

An assembling procedure of the "connection structure 9 between the electronic component assembly and the terminal fitting" is as follows. The terminal fitting 4 is connected to the end portion of the electric wire 5 in advance, the electric wire 5 with the terminal fitting is inserted into the second housing chamber 81 from the bottom of the second housing chamber 81, and the terminal fitting 4 is locked to the lance 82. The electronic component assembly 1 is inserted into the first housing chamber 80 and the second housing chamber 81 from the top of the holding member 8, and the other ends 6b of the bus bars 6 are assembled by being fitted to the terminal fitting 4. In addition, at the time of inserting the electronic component assembly 1 into the electronic component assembly housing portion 83, it can be easily inserted by pressing the resin member 7 with the top surface 20a of the relay main body 20 and the other end 6b of the bus bar 6 facing downward.

The electrical connection box has the above-described "connection structure 9 between the electronic component assembly and the terminal fitting", and the casing made of synthetic resin that attaches the holding member 8 of the "connection structure 9 between the electronic component assembly and the terminal fitting". Also, the "electrical connection box" is mounted in a vehicle, and performs the power supply and the signal transmission to the electronic device mounted on the vehicle. Furthermore, in the present invention, a junction block (also referred to as a "junction box"), a fuse block (also referred to as a "fuse box") and a relay block (also referred to as a "relay box") are collectively referred to as the electrical connection box below.

Furthermore, the electrical connection box of this embodiment is configured such that the holding member 8 is formed separately from the casing, but the present invention is not limited thereto, and the holding member 8 may be formed integrally with the casing. That is, the holding member 8 may be a part of the casing of the electrical connection box.

As described above, since the electronic component assembly 1 is configured such that the other ends 6b of the plurality of bus bars 6 are opposite to the side surfaces 20c and 20d of the relay main body 20, and thus an overall height dimension (indicated by h1 in FIG. 4) becomes a height dimension of the relay 2. The "connection structure 9 between the electronic component assembly and the terminal fitting" having such an electronic component assembly 1 is configured such that an overall height dimension (indicated by h2 in FIG. 4) of the holding member 8 becomes a height dimension of only the second housing chamber 81, rather than the dimensions obtained by adding the height dimension of the first housing chamber 80 and the height dimension of the second housing chamber 81. Thus, it is possible to reduce the housing space of the "connection structure 9 between the electronic component assembly and the terminal fitting" (that is, the housing space of the holding member 8) in the electrical connection box, and the overall height dimension of the electrical connection box can be reduced.

Furthermore, in the above-described embodiment, a configuration was provided in which the other end 6b of the bus bar 6 of the electronic component assembly 1 is opposite to the two opposing side surfaces 20c and 20d of the relay main body 20, but the present invention may adopt a configuration in which the other ends 6b of the plurality of bus bars 6 are opposite to one surface of the side surfaces 20c to 20f of four surfaces of the relay main body 20, a configuration in which the other ends 6b are opposite to the three surfaces, and a configuration in which the other ends 6b are opposite to all four surfaces.

Furthermore, in the above-described embodiment, the electronic component assembly 1 has the resin member 7, but the electronic component assembly 1 may not have the resin member 7 in the present invention. In that case, by setting the plurality of bus bars 6 on a temporary holding jig or the like, the one end 6a sides of these bus bars 6, the terminal portions 21 of the relay 2, and the terminal portions 31 of the diode 3 may be soldered.

Furthermore, in the present invention, the "connection structure between the electronic component assembly and the terminal fitting" and the electrical connection box may have an electronic component assembly 101 of a second embodiment described below, instead of the above-described electronic component assembly 1.

(Second Embodiment)

Figure 6:
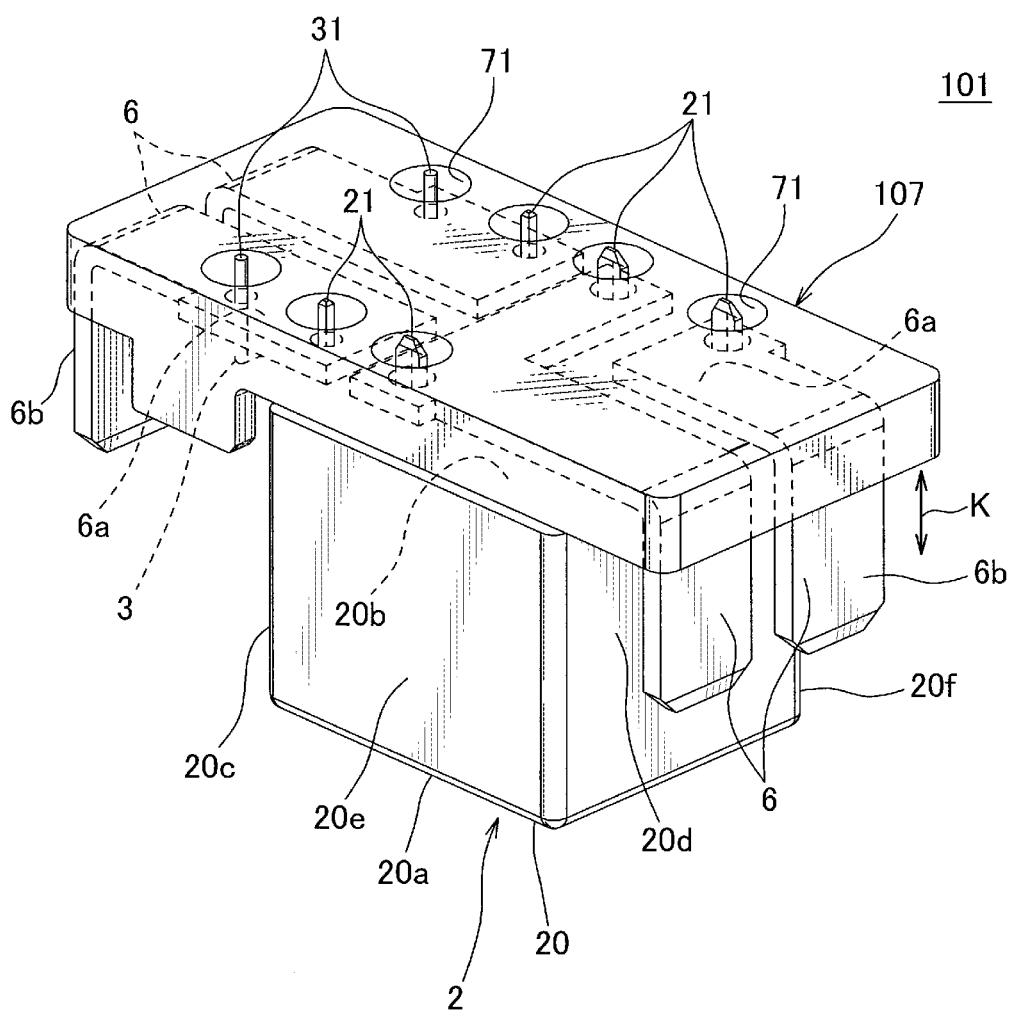
FIG. 6 is a perspective view of an electronic component assembly according to a second embodiment of the present invention.
Figure 7:
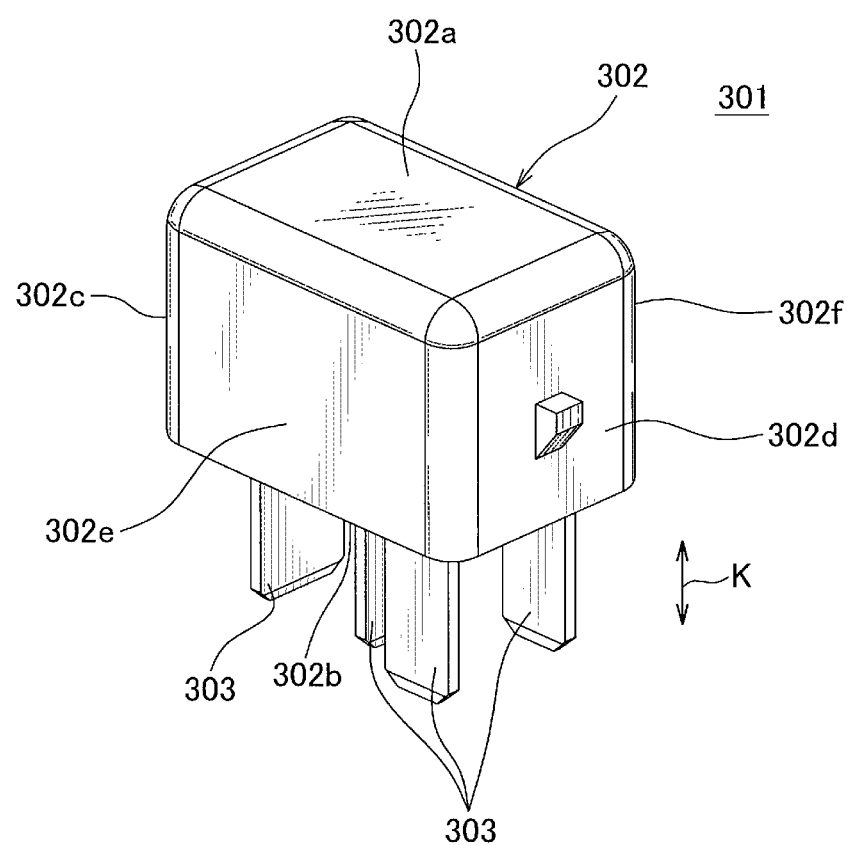
FIG. 7 is a perspective view of a conventional relay.
Figure 8:
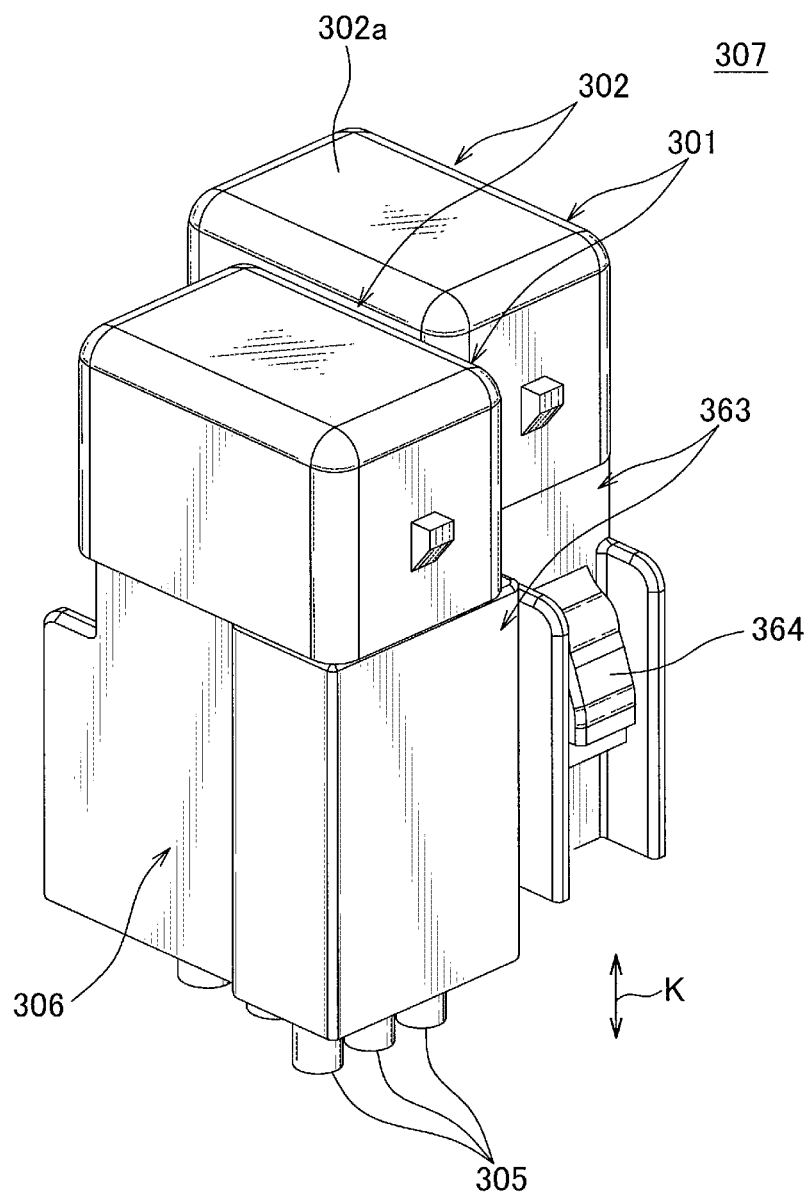
FIG. 8 is a perspective view of the connection structure between the terminal fitting and the relay illustrated in FIG. 7.
Figure 9:
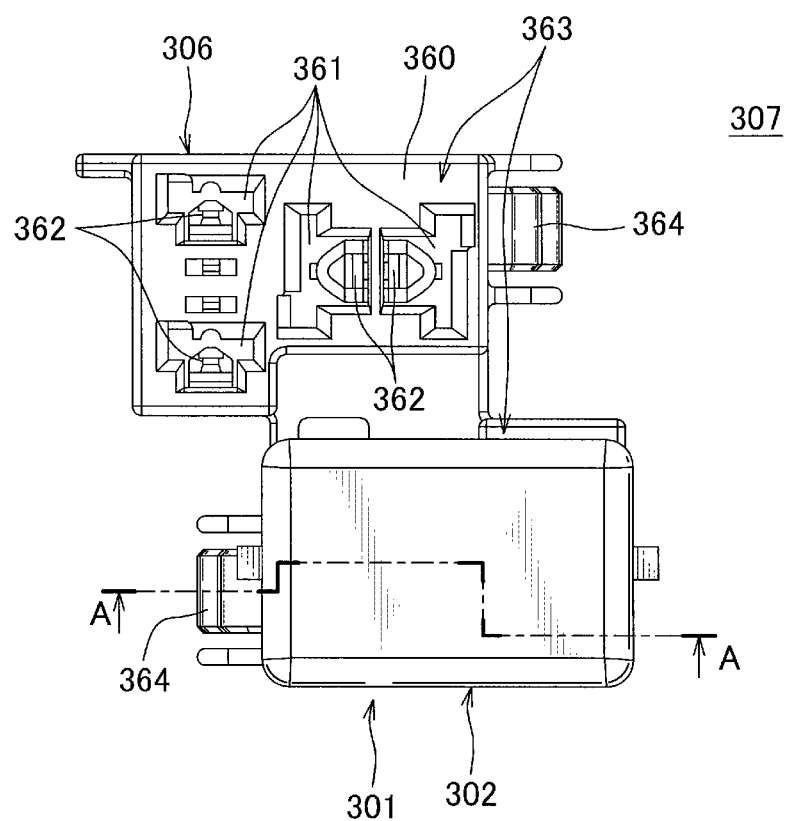
FIG. 9 is a plan view of the connection structure between the relay and the terminal fitting illustrated in FIG. 8.
Figure 10:
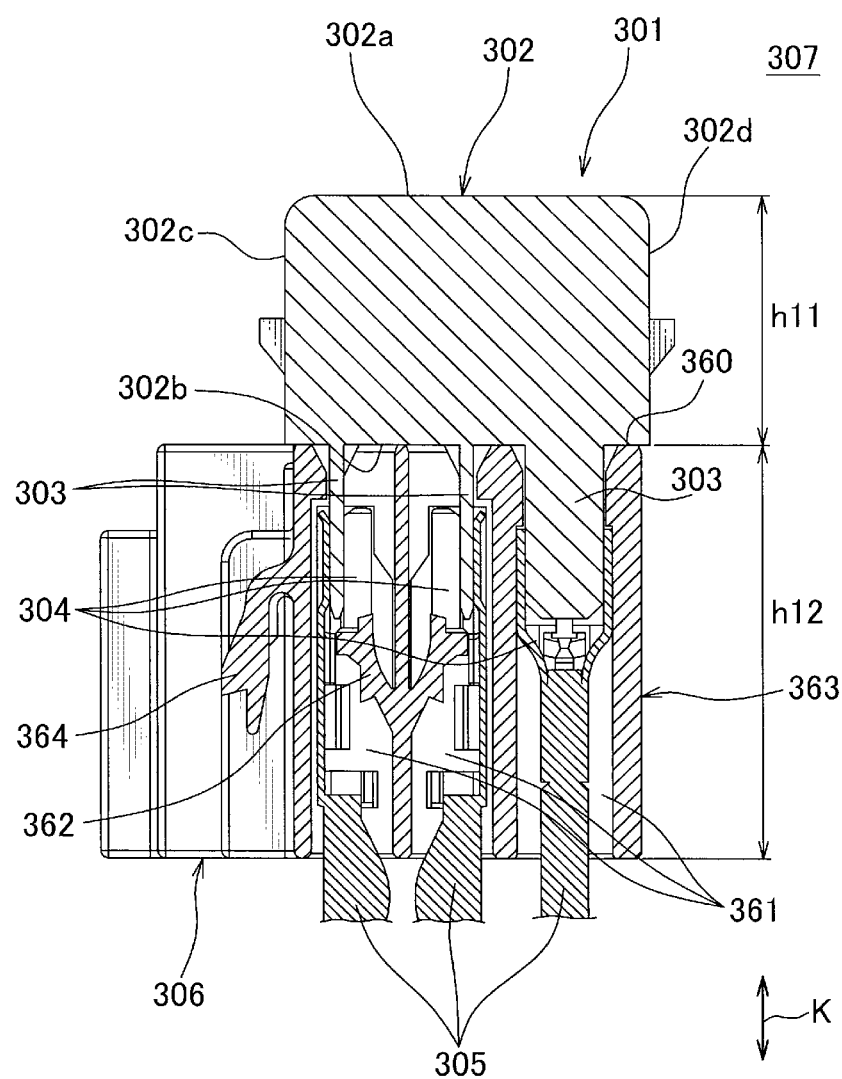
FIG. 10 is a cross-sectional view taken along a line A-A line of FIG. 9.

An "electronic component assembly" according to a second embodiment of the present invention will be described with reference to FIG. 6. Furthermore, in FIG. 6, the same components as those of the above-described first embodiment are denoted by the same reference numerals and the description thereof will not be provided.

An electronic component assembly 101 illustrated in the drawing is constituted by a relay ("electronic component" in the aspects of the present invention) 2, a diode 3, a plurality of bus bars 6, and a resin member 107. The resin member 107 in this embodiment has a configuration in which the resin member 7 of the first embodiment is extended in a longitudinal direction thereof. A portion bent at a right angle of each bus bar 6 is positioned inside the resin member 107.

In such an electronic component assembly 101, the resin member 107 can receive the force to be applied to the bus bar 6 when the other end 6b of the bus bar 6 and the terminal fitting 4 (illustrated in FIG. 4) are fitted, and therefore, it is possible to prevent the bus bar 6 from being deformed.

In addition, the bus bar 6 of the above-described second embodiment is bent at a right angle in the interior of the resin member 107, but in the present invention, the bus bar 6 may be bent at a right angle in contact with the opposite surface of the resin member 107 to the relay main body 20.

Furthermore, although the "electronic component assembly" having the "relay" as the "electronic component" has been described in the above-described first and second embodiments, as the "electronic component assembly" of the present invention, those having the "electronic component that is provided with the component main body having the rectangular parallelepiped outer shape, and the plurality of terminal portions protruding from the bottom surface of the component main body" are included, without being limited to the relay. For example, an electronic component assembly having "a fuse that is provided with a component main body having a rectangular parallelepiped outer shape and a plurality of terminal portions protruding from the bottom surface of the component main body", instead of the relay 2, is also included in the present invention.

Note that the above-described embodiments merely illustrate the typical embodiments of the present invention, and the present invention is not intended to be limited to the embodiments. That is, the present invention can be implemented by being modified in various ways without departing from the gist of the present invention.

REFERENCE SIGNS LIST

1, 101: electronic component assembly
2: relay (electronic component)
4: terminal fitting
6: bus bar
7, 107: resin member
8: holding member
9: connection structure between electronic component assembly and terminal fitting
20: relay main body (component main body)
20b: side surface
20c to 20f: side surface
21: terminal portion

The invention claimed is:

1. An electronic component assembly comprising
   an electronic component and
   a plurality of bus bars,
   the electronic component being provided with a component main body having
     a rectangular parallelepiped outer shape, and
     a plurality of terminal portions protruding from a bottom surface of the component main body,
   one end sides of the bus bars being electrically connected to the plurality of terminal portions, and the other ends thereof being fitted to a plurality of terminal fittings,
   wherein the other ends of the plurality of bus bars are opposite to a side surface of the component main body, and
   wherein an overall height dimension of the electronic component assembly becomes a height dimension of the electronic component.

2. The electronic component assembly according to claim 1, further comprising, a resin member to which the one end sides of the plurality of bus bars are attached.

3. The electronic component assembly according to claim 2, wherein the plurality of bus bars is bent at a right angle in contact with the resin member or is bent at a right angle in the interior of the resin member.

4. The electronic component assembly according to claim 1, wherein the other ends of the plurality of bus bars are opposite to two opposing side surfaces of the component main body.

5. The electronic component assembly according to claim 2, wherein the other ends of the plurality of bus bars are opposite to two opposing side surfaces of the component main body.

6. The electronic component assembly according to claim 3, wherein the other ends of the plurality of bus bars are opposite to two opposing side surfaces of the component main body.

7. A connection structure between an electronic component assembly and a terminal fitting, the connection structure comprising:
the electronic component assembly according to claim 1; wherein the plurality of terminal fittings that is fitted to the plurality of bus bars; and a holding member in which the electronic component assembly and the plurality of terminal fittings are housed.

8. A connection structure between an electronic component assembly and a terminal fitting, the connection structure comprising:
the electronic component assembly according to claim 2; wherein the plurality of terminal fittings that is fitted to the plurality of bus bars; and a holding member in which the electronic component assembly and the plurality of terminal fittings are housed.

9. A connection structure between an electronic component assembly and a terminal fitting, the connection structure comprising:
the electronic component assembly according to claim 3; wherein the plurality of terminal fittings that is fitted to the plurality of bus bars; and a holding member in which the electronic component assembly and the plurality of terminal fittings are housed.

10. A connection structure between an electronic component assembly and a terminal fitting, the connection structure comprising:
the electronic component assembly according to claim 4; wherein the plurality of terminal fittings that is fitted to the plurality of bus bars; and a holding member in which the electronic component assembly and the plurality of terminal fittings are housed.

11. A connection structure between an electronic component assembly and a terminal fitting, the connection structure comprising:
the electronic component assembly according to claim 5; wherein the plurality of terminal fittings that is fitted to the plurality of bus bars; and a holding member in which the electronic component assembly and the plurality of terminal fittings are housed.

12. A connection structure between an electronic component assembly and a terminal fitting, the connection structure comprising:
the electronic component assembly according to claim 6; wherein the plurality of terminal fittings that is fitted to the plurality of bus bars; and a holding member in which the electronic component assembly and the plurality of terminal fittings are housed.

13. An electrical connection box comprising:
the electronic component assembly according to claim 1; wherein the plurality of terminal fittings that is fitted to the plurality of bus bars; and a holding member in which the electronic component assembly and the plurality of terminal fittings are housed.

14. An electrical connection box comprising:
the electronic component assembly according to claim 2; wherein the plurality of terminal fittings that is fitted to the plurality of bus bars; and a holding member in which the electronic component assembly and the plurality of terminal fittings are housed.

15. An electrical connection box comprising:
the electronic component assembly according to claim 3; wherein the plurality of terminal fittings that is fitted to the plurality of bus bars; and a holding member in which the electronic component assembly and the plurality of terminal fittings are housed.

16. An electrical connection box comprising:
the electronic component assembly according to claim 4; wherein the plurality of terminal fittings that is fitted to the plurality of bus bars; and a holding member in which the electronic component assembly and the plurality of terminal fittings are housed.

17. An electrical connection box comprising:
the electronic component assembly according to claim 5; wherein the plurality of terminal fittings that is fitted to the plurality of bus bars; and a holding member in which the electronic component assembly and the plurality of terminal fittings are housed.

18. An electrical connection box comprising:
the electronic component assembly according to claim 6; wherein the plurality of terminal fittings that is fitted to the plurality of bus bars; and a holding member in which the electronic component assembly and the plurality of terminal fittings are housed.

* * * * *